(12) United States Patent
Nakata et al.

(10) Patent No.: US 7,560,751 B2
(45) Date of Patent: Jul. 14, 2009

(54) SEMICONDUCTOR PHOTO-DETECTING ELEMENT

(75) Inventors: Takeshi Nakata, Tokyo (JP); Kikuo Makita, Tokyo (JP); Atsushi Shono, Kawasaki (JP)

(73) Assignees: NEC Corporation, Tokyo (JP); NEC Electronics Corporation, Kawasaki-Shi (JP)

( * ) Notice: Subject to any disclaimer, the term of this patent is extended or adjusted under 35 U.S.C. 154(b) by 202 days.

(21) Appl. No.: 10/589,004

(22) PCT Filed: Feb. 4, 2005

(86) PCT No.: PCT/JP2005/001702

§ 371 (c)(1),
(2), (4) Date: Aug. 10, 2006

(87) PCT Pub. No.: WO2005/078809

PCT Pub. Date: Aug. 25, 2005

(65) Prior Publication Data

US 2007/0090397 A1    Apr. 26, 2007

(30) Foreign Application Priority Data

Feb. 13, 2004    (JP) .............................. 2004-036723

(51) Int. Cl.
*H01L 31/107* (2006.01)
(52) U.S. Cl. .................... 257/186; 257/184; 257/190; 257/438; 257/E31.063; 257/E31.064; 257/E31.116
(58) Field of Classification Search ................. 257/184, 257/186, 190, 438, E31.063, E31.064, E31.116
See application file for complete search history.

(56) References Cited

U.S. PATENT DOCUMENTS

| 5,281,844 | A | * | 1/1994 | Funaba | 257/438 |
| 5,552,629 | A | * | 9/1996 | Watanabe | 257/438 |
| 2003/0226952 | A1 | * | 12/2003 | Clark | 250/214.1 |

FOREIGN PATENT DOCUMENTS

JP    61-170079 A    7/1986

(Continued)

OTHER PUBLICATIONS

I. Watanabe et al., 'A New Planar-Structure InAlGaAs-InAlAs Superlattice Avalance Photodiode with a Ti-Implanted Guard-Ring', IEEE Photonics Technology Letters, 1996, vol. 8, No. 6, pp. 827 to 829.

*Primary Examiner*—Ngan Ngo
*Assistant Examiner*—Benjamin Tzu-Hung Liu
(74) *Attorney, Agent, or Firm*—Young & Thompson

(57) ABSTRACT

In a semiconductor photo-detecting element (an avalanche photodiode), a high-sensitivity element is obtained by incorporating a multiplication layer having high-performance multiplication characteristics. By using a structure which reduces an electric field applied to an etching stopper layer, it is possible to use a multiplication layer having higher-performance multiplication characteristics (a multiplication layer which performs multiplication with a high electric field). The first method to realize this is to use a conductivity type multiplication layer. The second method is to use a structure in which a field buffer layer of the second conductivity type is incorporated. As a result of the use of these methods, a structure which applies an electric field lower than the multiplier electrical field to the etching stopper layer is obtained.

17 Claims, 8 Drawing Sheets

FOREIGN PATENT DOCUMENTS

| | | |
|---|---|---|
| JP | 5-102517 A | 4/1993 |
| JP | 7-312442 A | 11/1995 |
| JP | 8-181349 A | 7/1996 |
| JP | 2000-022197 | 1/2000 |
| JP | 2000-323746 A | 11/2000 |
| JP | 2002-324911 A | 11/2002 |
| JP | 2004-31707 A | 1/2004 |

* cited by examiner

SEMICONDUCTOR PHOTO-DETECTING ELEMENT

BACKGROUND OF THE INVENTION

1. Field of the Invention

The present invention relates to a semiconductor photo-detecting element and, more particularly, to an avalanche photodiode (APD).

2. Description of the Related Art

The planar type superlattice avalanche photodiode (hereinafter abbreviated as APD) shown in FIG. 7 has been reported as a high-speed, high-sensitivity photo-detecting element for next-generation optical communication systems (Patent Document 1 and Non-patent Document 1).

Such conventional photo-detecting elements have high gain bandwidth product (GB product) and low-noise owing to the effect of an InAlAs/InAlGaAs superlattice multiplication layer on an increase in the ratio of the ionization rate and have a structure that only a stable InP planar pn junction is exposed to the surface. Therefore, they are characterized by being high-reliability elements.

More specifically, the layered structure of a conventional photo-detecting element consists, on a semiconductor substrate, of a buffer layer of the first conductivity type, a light-absorbing layer of the first conductivity type, a field buffer layer of the first conductivity type, a multiplication layer, an etching stopper layer, a buffer layer of the second conductivity type, and a contact layer of the second conductivity type.

For this layered structure, an impurity of the first conductivity type is diffused from the substrate surface to a peripheral portion of an isolation trench formed in the periphery of the element, and the upper surface of the peripheral portion is formed as an electrode of the first conductivity type, whereas an electrode of the second conductivity type is formed on the surface of the center of the element.

The width of the isolation trench is large relative to the distance over which the impurity is diffused, and no short circuit due to the diffusion of the impurity occurs.

The electrodes of the first and second conductivity type s are separated from each other by the isolation trench which is formed by performing etching from the surface to the etching stopper layer (after the formation of the isolation trench, a dielectric film is formed), and function as two electrodes of a diode.

Also, by doping an impurity to the bottom of this isolation trench, the electric field distribution is adjusted so that good breakdown characteristics can be obtained.

Because photo-detecting elements fabricated in this manner permit light-electricity conversion at high speeds and with high sensitivities, they are used especially effectively in receivers for optical communication and in devices for optical measurement.

Patent Document 1: Japanese Patent Laid-Open No. 7-312442

Non-patent Document 1: Watanabe et al., IEEE, Photonics Technol. Lett., pp. 827-829, vol. 8, 1996

In the structure of the conventional technology, as shown in FIG. 8, electric fields applied to the multiplication layer and the etching stopper layer have almost the same strength.

The APD of the planar type structure shown in the related art uses a superlattice structure as the multiplication layer, and this structure is characterized by multiplication from a low electric field. In the case of a superlattice structure, an electric field applied to the multiplication layer is low and, therefore, the breakdown electrical field strength of the etching stopper layer is not exceeded. For this reason, the dark current problem is not a great problem.

On the other hand, when a multiplication layer having a higher GB product is to be obtained, there has been known a method which involves increasing the value of GB product, for example, by reducing the film thickness of a single layer of InAlAs as the multiplication layer without using a superlattice structure.

InP is often used as a material for the etching stopper layer. The reason is that the etching selective ratio can be set at a high value compared to materials, such as InAlAs, InGaAs and InAlGaAs. On the other hand, InP has a low breakdown electrical field strength compared to InAlAs and InAlGaAs. For this reason, InP is a material desirable for an etching stopper. However, in a case where the GB characteristics are to be improved by reducing the film thickness of the electronic multiplication layer (increasing the field strength applied to the electronic multiplication layer), a high field strength exceeding the breakdown electrical field strength of the etching stopper layer is applied to the etching stopper layer and a very large dark current is generated in the etching stopper layer, deteriorating the multiplication characteristics and increasing noise of the device.

Incidentally, in addition to InP, as the etching stopper layer $In_xGa_{(1-x)}As_yP_{(1-y)}$ ($0 \leq x \leq 1.0$, $0 \leq y \leq 1.0$) and AlAsSb can also be used under lattice matching conditions with InP.

Therefore, it is impossible to apply the technique for fabricating a high-sensitivity semiconductor photo-detecting element by using a multiplication layer in which the GB product is Improved by reducing the film thickness of the multiplication layer.

SUMMARY OF THE INVENTION

The present invention provides a semiconductor photo-detecting element comprising, wherein at least a buffer layer of the first conductivity type, a light-absorbing layer, a field buffer layer of the first conductivity type, a multiplication layer, an etching stopper layer, a buffer layer of the second conductivity type, and a contact layer of the second conductivity type formed on a semiconductor substrate in this order, and a field strength applied to the etching stopper layer is lower than a field strength applied to the multiplication layer. An impurity of the light-absorbing layer may be of either the first conductivity type or the second conductivity type.

In the present invention, it is preferred that the breakdown electrical field strength of the etching stopper layer be lower than the breakdown electrical field strength of the multiplication layer, that the field strength applied to the etching stopper layer be lower than the breakdown electrical field strength of the etching stopper layer or the field strength applied to the multiplication layer be higher than the breakdown electrical field strength of the etching stopper layer.

For this reason, in the present invention, between the multiplication layer and the etching layer there may be provided a field buffer layer of the second conductivity type which relaxes the field of the multiplication layer or an impurity of the multiplication layer may be of either the first conductivity type or the second conductivity type. When the impurity is of the second conductivity type, it is more preferred that the impurity has an impurity concentration of not less than $1 \times 10^{16}$ (cm$^{-3}$).

In the present invention, it is preferred that the multiplication layer be a single layer in which the ratio of elements forming the multiplication layer is constant. It is more preferred that the multiplication layer be a layer formed from InAlAs and it is more preferred that the multiplication layer have a thickness of not more than 0.3 µm.

In this case, it is preferred that the etching stopper layer be a layer formed from InP or $In_xGa_{(1-x)}As_yP_{(1-y)}$ ($0 \leq x \leq 1.0$, $0 \leq y \leq 1.0$).

When an impurity is added to the multiplication layer, it is preferred that the layer thickness (dm (cm)) of the multiplication layer, the impurity concentration of the second conductivity type (Ndm ($cm^{-3}$)), and the magnitude of the electric field ($\Delta Em$ (kV/cm)) which relaxes the field strength applied to the multiplication layer satisfy the relationship $Ndm \geq k \times eO \times \Delta Em/(q \times dm)$.

When a field buffer layer Is provided, it is preferred that the layer thickness (dk (cm)) of the field buffer layer of the second conductivity type, the impurity concentration of the second conductivity type (Ndk ($cm^{-3}$)), and the magnitude of the electric field ($\Delta Ek$ (kV/cm)) which relaxes the field strength applied to the multiplication layer satisfy the relationship $Ndk \geq k \times eO \times \Delta Ek/(q \times dk)$.

By using a structure which reduces the electric field applied to the etching stopper layer, it is possible to use a multiplication layer having higher-performance multiplication characteristics (a multiplication layer which performs multiplier by a high electric field).

By adopting the first method, an electric field applied to the adjoining etching stopper layer can be reduced compared to a maximum field strength in the multiplication layer and it becomes possible to keep the electric field lower than the breakdown electrical field strength of the etching stopper layer.

For example, in a case where a maximum value of the multiplier electrical field of the multiplication layer is 700 (kV/cm) and the breakdown electrical field strength of the etching stopper layer is 600 (kV/cm), it is possible to reduce a dark current in the etching stopper layer if an electric field is reduced by not less than about 100 (kV/cm) in the interior of the multiplication layer.

Therefore, by setting the multiplication layer thickness at 0.2 µm and the impurity concentration of the second conductivity type at $5 \times 10^{16}$ ($cm^{-3}$), the field strength in the etching stopper layer can be reduced by 145 (kV/cm). That is, 700−145=555 (kV/cm) and this value is large enough to withstand as an electric field.

As a result of this, it is possible to use a structure of an etching stopper layer having a breakdown electrical field strength of 600 (kV/cm) while using a multiplication layer having a high field strength of 700 (kV/cm).

Owing to this multiplication layer of a high multiplier electrical field strength, an APD can be given characteristics in which the GB product is improved and a dark current is equivalent to the level of the related art or below.

Therefore, it is possible to form an avalanche photodiode having higher speeds and higher sensitivities than the related art.

By adopting the second method, an electric field whose magnitude is relaxed by the field buffer layer from the field strength applied to the multiplication layer is applied to the etching stopper layer, and it becomes possible to use a material having a multiplier electrical field strength which is larger than the field strength which the etching stopper layer withstands.

For example, in a case where a maximum value of the multiplier electrical field of the multiplication layer is 650 (kV/cm) and the breakdown electrical field strength of the etching stopper layer is 550 (kV/cm), it is possible to suppress a dark current generated in the etching stopper layer if there is a field relaxation function of not less than 100 (kV/cm) in the relaxation layer of the second conductivity type between the multiplication layer and the etching stopper layer.

By setting the thickness of the relaxation layer of the second conductivity type at 0.1 µm and the impurity concentration at $1 \times 10^{17}$ ($cm^{-3}$), it is possible to relax the electric field by 145 (kV/cm). Therefore, the electric field in the etching stopper field is calculated as follows: 650−145=455 (kV/cm). This is a sufficiently low electric field.

As a result of this, it is possible to use a structure of an etching stopper layer having a breakdown electrical field strength of 550 (kV/cm) while using a multiplication layer having a high field strength of 650 (kV/cm).

Owing to this multiplication layer of a high multiplier electrical field strength, an APD can be given characteristics in which the GB product is improved and a dark current is equivalent to the level of the related art or below. Therefore, it is possible to form an avalanche photodiode having higher speeds, higher sensitivities and lower noise than the related art.

The present invention can also be applied to an APD of a conventional structure. In this case, because the field strength applied to the etching stopper layer is relaxed, this produces the effect that it is possible to further reduce a dark current and that an improvement of the characteristics (low noise design) can be achieved.

Figure 1:
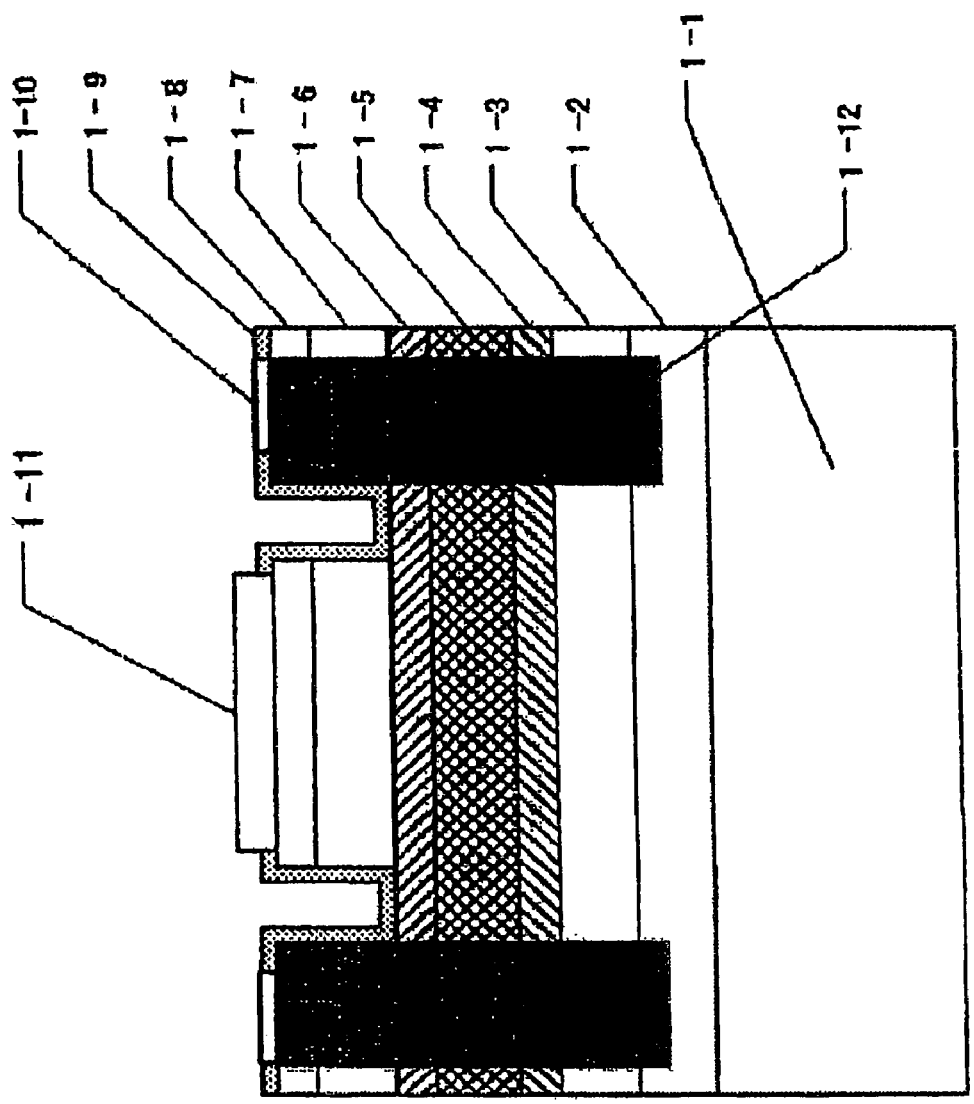
FIG. 1 is an explanatory diagram (1) of the First Embodiment of the present invention.

In these drawings, the symbols have the following meanings; 1-1 Semiconductor substrate, 1-2 Buffer layer of the first conductivity type, 1-3 Light-absorbing layer of the first conductivity type, 1-4 Field buffer layer of the first conductivity type, 1-5 multiplication layer of the second conductivity type, 1-6 Etching stopper layer, 1-7 Buffer layer of the second conductivity type, 1-8 Contact layer of the second conductivity type, 1-9 Dielectric film, 1-10 Electrode, 1-11 Electrode, 1-12 Impurity diffusion region, 1-1-1 Breakdown electrical field strength of etching stopper layer, 1-1-2 ΔE, 1-1-3 Line of field distribution, 1-3-1 InP semiconductor substrate, 1-3-2 p type buffer layer, 1-3-3 p type light-absorbing layer, 1-3-4 p type field buffer layer 1-3-5 n type multiplication layer, 1-3-6 Etching stopper layer, 1-3-7 n type buffer layer, 1-3-8 n type contact layer, 1-3-9 SiNx dielectric film, 1-3-10 p electrode, 1-3-11 n electrode, 1-3-12 Zn diffusion region, 2-1 Semiconductor substrate, 2-2 Buffer layer of the first conductivity type, 2-3 Light absorbing layer of the first conductivity type, 2-4 Field buffer layer of the first conductivity type, 2-5-1 multiplication layer, 2-5-2 Field buffer layer of the second conductivity type, 2-6 Etching stopper layer, 2-7 Buffer layer of the second conductivity type, 2-8 Contact layer of the second conductivity type, 2-9 Dielectric film, 2-10 Electrode, 2-11 Electrode, 2-12 Impurity diffusion region, 2-2-1 Breakdown electrical field strength of etching stopper layer, 2-2-2 ΔE, 2-2-3 Line of field distribution, 2-3-1 Semiconductor substrate, 2-3-2 p type buffer layer, 2-3-3 p type light-absorbing layer, 2-3-4 p type field buffer layer, 2-3-5-1 multiplication layer, 2-3-5-2 n type field buffer layer, 2-3-6 Etching stopper layer, 2-3-7 n type buffer layer, 2-3-8 n type contact layer, 2-3-9 SiNx dielectric film, 2-3-10 p electrode, 2-3-11 n electrode, 2-3-12 Zn diffusion region, 3-1 Semiconductor substrate, 3-2 Buffer layer of the first conductivity type, 3-3 Light-absorbing layer of the first conductivity type, 3-4 Field buffer layer of the first conductivity type, 3-5 multiplication layer, 3-6 Etching stopper layer, 3-7 Buffer layer of the second conductivity type, 3-8 Contact layer of the second conductivity type, 3-9 Dielectric film, 3-10 Electrode, 3-11 Electrode, 3-12 Impurity diffusion region, 3-2-1 Breakdown electrical field strength of etching stopper layer, 3-2-2 Line of field distribution.

DETAILED DESCRIPTION OF PREFERRED EMBODIMENTS

In order to ensure that an electrical field higher than the breakdown electrical field strength of an etching stopper layer can be applied to a multiplication layer, the field strength applied to the multiplication layer is relaxed and the field strength applied to the etching stopper layer is set at a lower value than the field strength applied to the multiplication layer. The present inventors found out that this can be realized by the following methods.

In the first method, a multiplication layer adjoining an etching stopper layer is doped with an impurity of the second conductivity type and the function of relaxing an electric field is given to the multiplication layer.

In the second method, a multiplication layer is formed as a structure which is doped with a low-concentration impurity regardless of the conductivity types, and between the multiplication layer and an etching stopper layer there is provided a field buffer layer having the function of field relaxation which is doped with an impurity of the second conductivity type.

The first method is such that the field strength in the interior of the multiplication layer is reduced by doping the multiplication layer having a high multiplier strength with an impurity of the second conductivity type.

By using this method, the electrical field strength applied to the etching stopper layer can be reduced by a necessary amount or In a range exceeding this necessary amount in comparison with the multiplier electrical field strength.

On that occasion, the relationship among the amount by which the electric field is to be reduced, the layer thickness of the multiplication layer, and the impurity concentration can be expressed by Equation (1) below.

$$\Delta Em = q \times dm \times Ndm / (k \times eO) \quad (1)$$

where, ΔEm: amount by which the electric field is to be reduced (kV/cm), q: elementary quantity of electric charge, dm: multiplication layer thickness (cm), Ndm: impurity concentration of multiplication layer (cm$^{-3}$), k: dielectric constant of multiplication layer, and eO: permittivity in a vacuum.

If a multiplication layer having a thickness of 0.2 μm and an impurity concentration of $2 \times 10^{16}$ (cm$^{-3}$) is used, from Equation (1) about 58 (kV/cm) is obtained as the amount of a reduced electric field ΔEm as viewed from a maximum electric field.

In this manner, the amount of a reduced electric field can be determined by setting the impurity concentration and thickness of the multiplication layer.

In the second method, a field buffer layer is inserted between a multiplication layer having a high multiplier electrical field strength and an etching stopper layer. By using this method, the field strength applied to the etching stopper layer can be reduced by a necessary amount or in a range exceeding this necessary amount in comparison with the field strength applied to the multiplication layer.

The multiplication layer may be doped with either of an impurity of the first conductivity type or an impurity of the second conductivity type so long as it has a very low impurity concentration.

The amount by which the electric field is to be relaxed in the field buffer layer, ΔEk, can be expressed by Equation (2) below.

$$\Delta Ek = q \times dk \times Ndk / (k \times eO) \quad (2)$$

where, dk is the layer thickness of the field buffer layer, Ndk is the impurity concentration of the field buffer layer (the conductivity type is the same conductivity type as the multiplication layer of the second conductivity type), q is the elementary quantity of electric charge, and k is the dielectric constant of the field buffer layer.

For example, if the thickness and concentration of the field buffer layer of the second conductivity type are, respectively, 0.1 μm and $5 \times 10^{16}$ (cm$^{-3}$), the amount of the relaxed electric field ΔEk becomes about 72 (kV/cm).

First Embodiment

The First Embodiment will be described In detail by using FIGS. 1 and 2.

FIG. 1 shows a schematic structural section of this embodiment.

On a semiconductor substrate 1-1 (any conductivity type may be used), there is formed a layered structure which is constituted, in sequence from the semiconductor substrate 1-1, by a buffer layer of the first conductivity type 1-2, a light-absorbing layer of the first conductivity type 1-3, a field buffer layer of the first conductivity type 1-4, a multiplication layer of the second conductivity type 1-5, an etching stopper layer 1-6, a buffer layer of the second conductivity type 1-7, and a contact layer of the second conductivity type 1-8.

Next, in order to provide electrodes for the light-absorbing layer and the contact layer on the surface, an isolation trench between the electrodes is formed from the surface to the depth of the etching stopper layer. After that, a dielectric film 1-9 which serves as an insulating film, such as a silicon oxide film or a silicon nitride film, is formed on the whole surface. Incidentally, the dielectric film may be films other than a silicon oxide film and a silicon nitride film. After that, the dielectric film in the electrode formation region of the light-absorbing layer at the periphery of the isolation trench is removed, and an impurity of the first conductivity type is doped and diffused until the impurity reaches the buffer layer, whereby an impurity diffusion region 1-12 is formed. Next, the dielectric film in the electrode formation region of the contact layer in the interior of the isolation trench is removed.

Electrodes 1-11 and 1-12 are formed in the electrode formation region for the light-absorbing layer and the contact layer.

If the multiplication layer 1-5 is exposed to the surface of the isolation trench, a surface leak current is generated, deteriorating the characteristics. Therefore, it is necessary to provide the etching stopper layer 1-6 between the multiplication layer 1-5 and the buffer layer of the second conductivity type 1-6.

When selective etching is performed for a III-V group compound semiconductor, in an etching stopper layer, a V group element different from an element of a layer formed as a layer on the etching stopper layer is used. Therefore, a high selectivity can be obtained even when the impurity concentration of either of the layers becomes higher.

It is preferred that in the etching stopper layer 1-6, a V group element different from an element constituting the multiplication layer 1-5, which forms a layer under the etching stopper layer 1-6, be used. If the same element is used, the etching stopper layer 1-6 obtains the same function as the multiplication layer 1-5, which constitutes a layer under the etching stopper layer 1-6. This is because in this case, the etching stopper layer 1-6 obtains the same function as when the multiplication layer under the etching stopper layer 1-6 becomes thick.

Incidentally, the light-absorbing layer may be of the second conductivity type as with the Second Embodiment.

Figure 2:
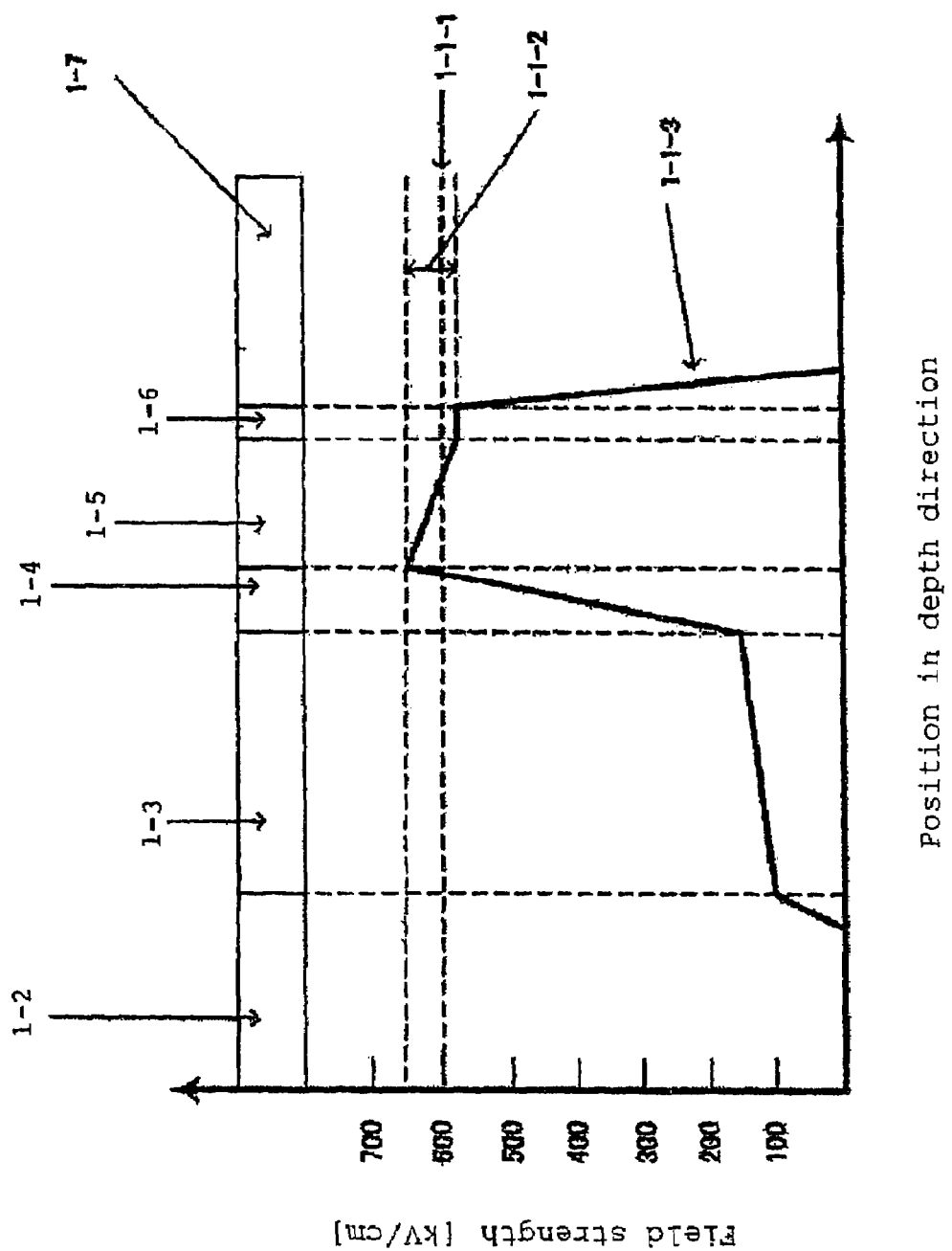
FIG. 2 is an explanatory diagram (2) of the First Embodiment of the present invention.

A schematic diagram of the distribution of electric fields applied to each layer is shown in FIG. 2. In this embodiment, the impurity concentration of the multiplication layer is increased. As a result, as shown in FIG. 2, the multiplication layer of the second conductivity type has the function of relaxing the electric field. A maximum field strength applied to the multiplication layer is relaxed, and an electric filed lower than the maximum field strength applied to the multiplication layer of the second conductivity type is applied as an electrical field applied to the etching stopper layer. For this reason, even when the maximum electrical field strength of the multiplication layer is larger than in the related art, a dark current does not increase and it is possible to obtain multiplication characteristics having a high S/N ratio of a multiplication current.

More specifically, for example, in a case where InAlAs is used as the material and the multiplication layer has a layer thickness of 0.3 μm, the maximum electric field of the multiplication layer becomes about 600 to 650 (kV/cm).

When InP is used as the etching stopper layer, its breakdown electrical field strength becomes 600 (kV/cm). In this case, the electric field applied to the etching stopper layer becomes not more than the breakdown electrical field strength if the electric field is reduced by about 50 (kV/cm) in the multiplication layer. The amount of an electric field capable of being reduced in the multiplication layer $\Delta Em$ is given by Equation (3) below.

$$\Delta Em = q \times dm \times Ndm/(k \times eO) \quad (3)$$

where, $q=1.6\times10^{-19}$ (C), $eO=8.85\times10^{-14}$ (permittivity in a vacuum, expressed by cm), $dm$=layer thickness of the multiplication layer (cm), $Ndm$=impurity concentration of the multiplication layer (cm$^{-3}$), and $k=12.5$ (dielectric constant of the multiplication layer).

In a case where a multiplication layer having a thickness of 0.3 μm and an impurity concentration of the second conductivity type of $1.5\times10^{16}$ (cm$^{-3}$) is used, from Equation (3) the amount of a reduced field $\Delta Em=65$ (kV/cm) is obtained.

In this manner, the amount of a reduced field can be determined by setting the impurity concentration and thickness of the multiplication layer. To increase the GB product is the purpose of using a thin-film multiplication layer which is a single layer, and if the film thickness does not exceed 0.3 μm, the impurity concentration of the multiplication layer is preferably not less than $1.0\times10^{16}$ (cm$^{-3}$) and more preferably $1.5\times10^{16}$ (cm$^{-3}$). Impurity concentrations of not less than $1\times10^{16}$ (cm$^{-3}$) are sufficiently high impurity concentrations compared to those from $1\times10^{15}$ to $5\times10^{15}$ (cm$^{-3}$), which are impurity concentrations in the undope case.

Because device operations are possible if the amount by which the electric field is to be reduced in the interior of the multiplication layer is larger than described in the above-described case, it is necessary only that the impurity concentration of the above-described multiplication layer be thicker than $1.5\times10^{16}$ (cm$^{-3}$).

Because the present invention has as its main object to make it possible to use a multiplication layer of the planar type structure having a high multiplier electrical field strength as in a thin-film ($\leqq 0.3$ μm) multiplication layer which has a high GB product, the thickness of the multiplication layer is often first determined.

Therefore, in many cases, the layer thickness of the multiplication layer is first determined and after that, a concentration suited to a necessary amount of an electric field to be reduced is calculated from an equation.

Therefore, after the determination of the film thickness dm, the impurity concentration can be calculated from Equation (4) below by adding the condition that concentrations thicker than the above concentration are allowed.

$$Ndm \leqq k \times eO \times \Delta Em/(q \times dm) \quad (4)$$

If in a structure meeting this condition, a multiplication layer having an electric field higher than in the related art is applied to a planar type APD, then it becomes possible to obtain a device which ensures device operations of a higher GB product with a multiplication dark current equivalent to that of the related art and a lower multiplication dark current with a GB product equivalent to that of the related art.

Second Embodiment

The Second Embodiment will be described in detail by using FIG. 4.

Figure 4:
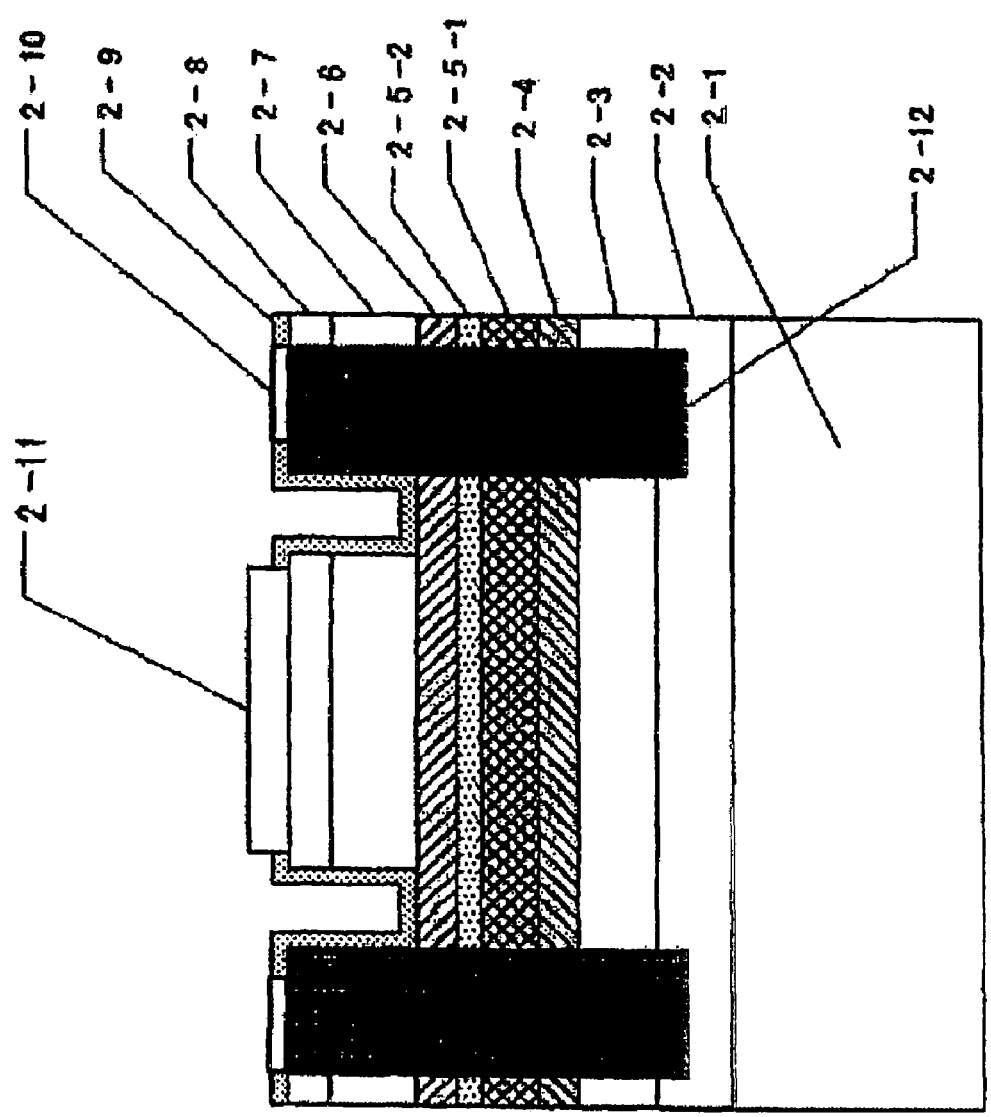
FIG. 4 is an explanatory diagram (1) of the Second Embodiment of the present invention.

FIG. 4 shows a schematic structural section of this embodiment.

On a semiconductor substrate 2-1 (any conductivity type may be used), there is formed a layered structure which is constituted, in sequence from the semiconductor substrate 2-1, by a buffer layer of the first conductivity type 2-2, a light-absorbing layer of the first conductivity type 2-3, a field buffer layer of the first conductivity type 2-4, a multiplication layer 2-5-1, a field buffer layer of the second conductivity type 2-5-2, an etching stopper layer 2-6, a buffer layer of the second conductivity type 2-7, and a contact layer of the second conductivity type 2-8.

Next, in order to provide electrodes for the light-absorbing layer and the contact layer on the surface, an isolation trench between the electrodes is formed from the surface to the depth of the etching stopper layer. After that, a dielectric film 2-9 which serves as an insulating film, such as a silicon oxide film and a silicon nitride film, is formed on the whole surface. Incidentally, the dielectric film may be films other than a silicon oxide film and a silicon nitride film. After that, the dielectric film in the electrode formation region of the light-absorbing layer at the periphery of the isolation trench is removed, and an impurity of the first conductivity type is caused to diffuse until the impurity reaches the buffer layer, whereby an impurity diffusion region 2-12 is formed. Next, the dielectric film in the electrode formation region of the contact layer in the interior of the isolation trench is removed.

Electrodes 1-11 and 1-12 are formed in the electrode formation region for the light-absorbing layer and the contact layer.

Figure 5:
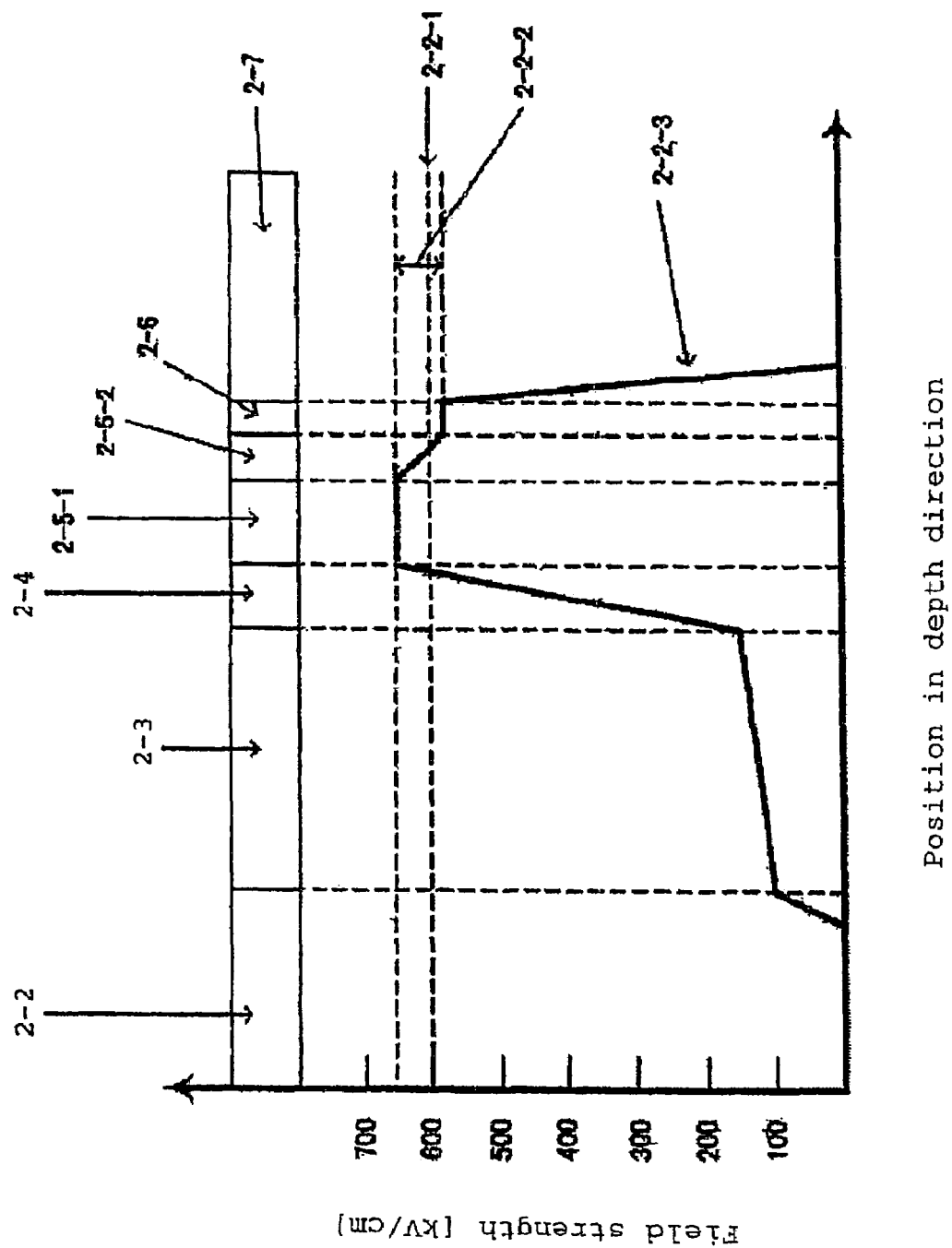
FIG. 5 is an explanatory diagram (2) of the Second Embodiment of the present invention.

A schematic diagram of the distribution of electric fields applied to each layer is shown in FIG. 5. In this embodiment, a field buffer layer of the second conductivity type is provided In order to relax electric fields. As a result, as shown in FIG. 5, an electric field applied to the multiplication layer of the second conductivity type is relaxed by the field buffer layer of the second conductivity type, a field strength applied to the multiplication layer is relaxed, and a magnetic field having a lower field strength than the field strength applied to the multiplication layer of the second conductivity type is applied as a field strength applied to the etching stopper layer. For this reason, even when the maximum strength of the electric field of the multiplication layer is larger than in the related art, a dark current does not increase and it is possible to obtain multiplication characteristics having a high S/N ratio of a multiplication current.

More specifically, for example, in a case where InAlAs is used as the material and the multiplication layer has a layer thickness of 0.2 μm, the maximum electric field of the multiplication layer becomes about 650 to 700 (kV/cm).

When InP is used as the etching stopper layer, its breakdown electrical field strength becomes 600 (kV/cm). In this case, the electric field applied to the etching stopper layer becomes not more than the breakdown electrical field strength if the electric field is reduced by not less than about 100 (kV/cm) in the field buffer layer of the second conductivity type. The amount of electric field capable of being reduced in the multiplication layer $\Delta Ek$ is given by Equation (6) below.

$$\Delta Ek = q \times dk \times Ndk/(k \times eO) \qquad (5)$$

where, $q=1.6\times10^{-19}$ (C), $eO=8.85\times10^{-14}$ (permittivity in a vacuum, expressed by cm), dk=layer thickness of the relaxation layer of the second conductivity type (cm), Ndk=impurity concentration of the relaxation layer of the second conductivity type (cm$^{-3}$), and k=12.5 (dielectric constant of the relaxation layer of the second conductivity type).

For example, when the relaxation layer of the second conductivity type is formed with a layer thickness of 0.1 μm and an impurity concentration of $1\times10^{17}$ (cm$^{-3}$), $\Delta Ek=145$ (kV/cm) and the above-described conditions can be met.

Because the device functions if the amount of a relaxed electric field is not less than this value, the conditions for concentration and film thickness can be expressed by Equation (7) below.

$$\Delta Ek \leq q \times dk \times Ndk/(k \times eO) \qquad (6)$$

It is possible to obtain the effect of reducing a dark current in the etching stopper layer by fabricating a device so as to meet the conditions of Equation (6).

Incidentally, the First and Second Embodiments were described in the case where InAlAs having a small film thickness is used as the multiplication layer in order to increase the GB product compared to the related art. However, the present invention can be applied to a semiconductor is photo-detecting element of the conventional structure. When the present invention is applied to the related art, the field strength applied to the etching stopper layer decreases. Because the field strength applied to the etching stopper layer is relaxed, a dark current decreases compared to the related art, producing the effect that the characteristics are improved (low-noise designs).

EXAMPLES

Example 1

Figure 3:
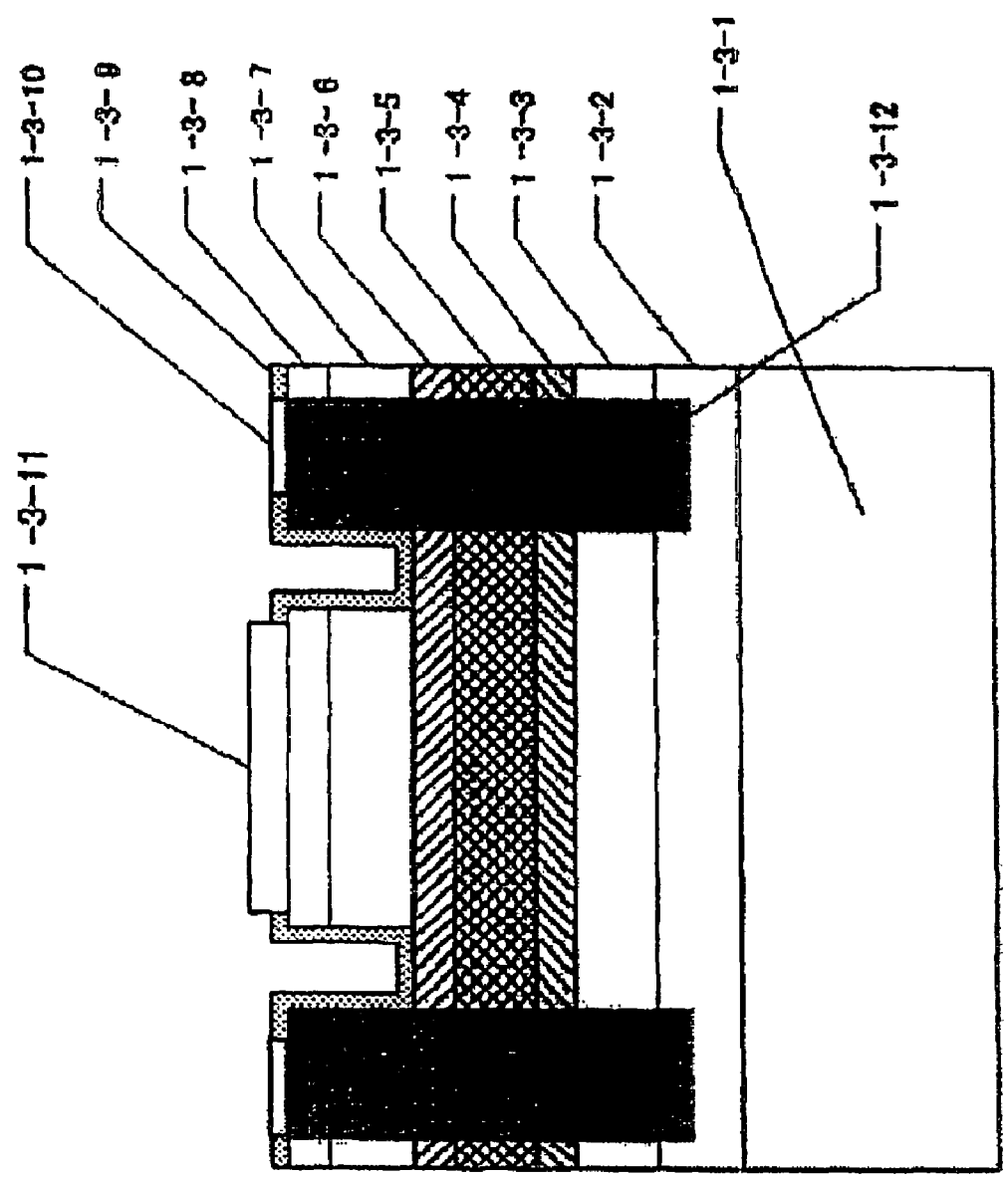
FIG. 3 is an explanatory diagram of Example 1.

As shown in FIG. 3, on an n type or a p type (or an SI (semi-insulating)) InP semiconductor substrate 1-3-1, there are laminated a p type buffer layer of InP, InAlAs or InAlGaAs 1-3-2, a p type light-absorbing layer of InGaAs 1-3-3, a p type field buffer layer 1-3-4, an n type multiplication layer 1-3-5, an etching stopper layer 1-3-6, an n type buffer layer 1-3-7 and an n type contact layer 1-3-8 and a planar type APD is obtained by performing isolation etching, dielectric passivation (an SiN$_x$ dielectric layer 1-3-9) and the like for this structure.

InAlAs having a film thickness of 0.3 μm and an impurity concentration of $3\times10^{16}$ (cm$^{-3}$) is used as the n type multiplication layer 1-3-5, InP of 0.1 μm is used as the etching stopper layer 1-3-6, InAlAs having a film thickness of 0.5 μm and an impurity concentration of $1\times10^{18}$ (cm$^{-3}$) is used as the n type buffer layer 1-3-7, and InGaAs having a film thickness of 0.2 μm and an impurity concentration of $5\times10^{18}$ (cm$^{-3}$) is used as the n type contact layer 1-3-8.

Incidentally, it is also possible to use an n type light-absorbing layer in place of the p type light-absorbing layer.

This n type multiplication layer 1-3-5 has the function of lowering an electric field by 130 (kV/cm), and even in the operation condition under which the maximum value of the multiplier electrical field is 650 (kV/cm), the electric field applied to the InP etching stopper layer 1-3-6 becomes 520 (kV/cm).

As a result of this, it is possible to simultaneously meet the requirement that the multiplication layer is a structure having a multiplier electrical field higher than the breakdown electrical field strength of the etching stopper layer 1-3-6 and the requirement that the structure have a low dark current.

In a device thus fabricated, a dark current decreased on the whole surface in the interior of a wafer. A dark current in a device with a photo-detecting diameter of 30 μm was measured. Under the condition where the temperature is 0 to 85 (° C.), it was possible to obtain a dark current of not more than 500 (nA) at 0.9 Vb.

Vb is breakdown voltage.

For the GB product, it was possible to obtain a gain bandwidth product of 80 (GHz) (under a load of 50 (Ω)).

For device reliability, it is estimated that a life of not less than 1 million hours is obtained.

These characteristics are especially effective for use in receivers for optical communication.

To simultaneously meet these characteristics is made possible only when the structure proposed in the present specification is used.

Example 2

Figure 6:
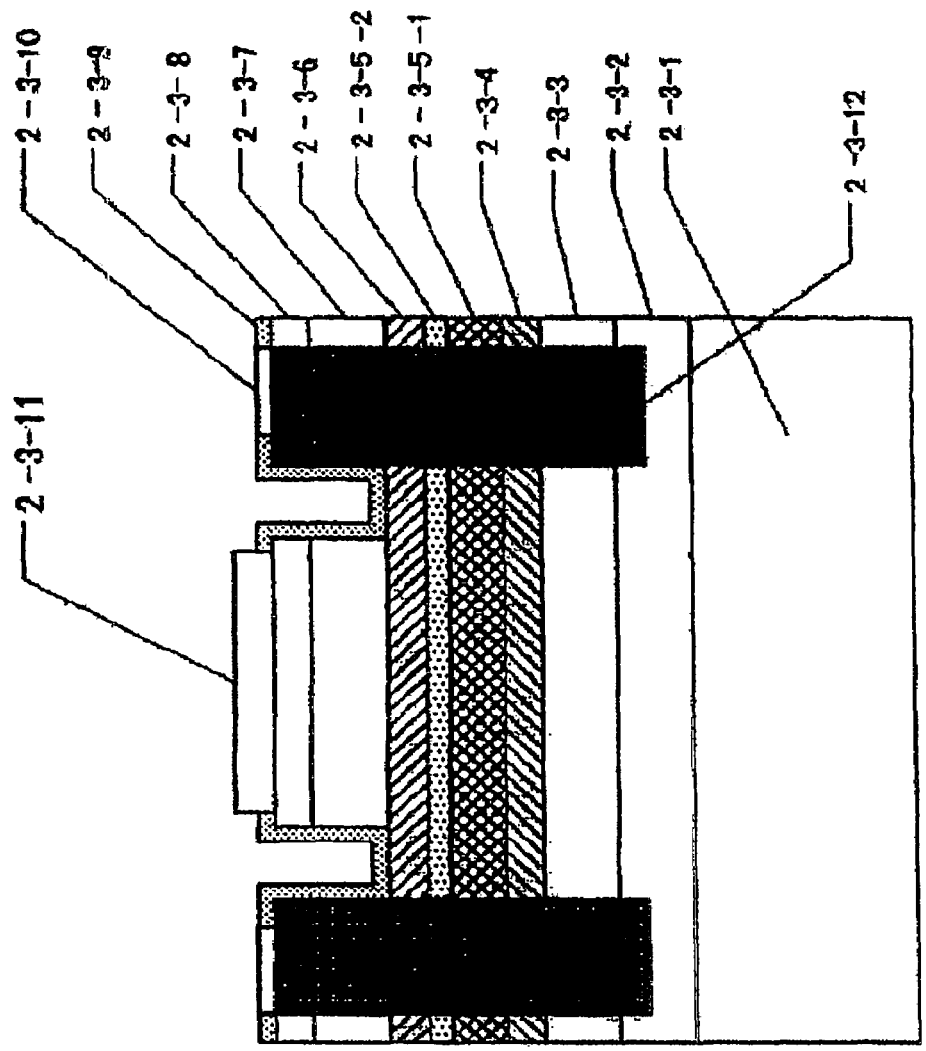
FIG. 6 is an explanatory diagram of Example 2.
Figure 7:
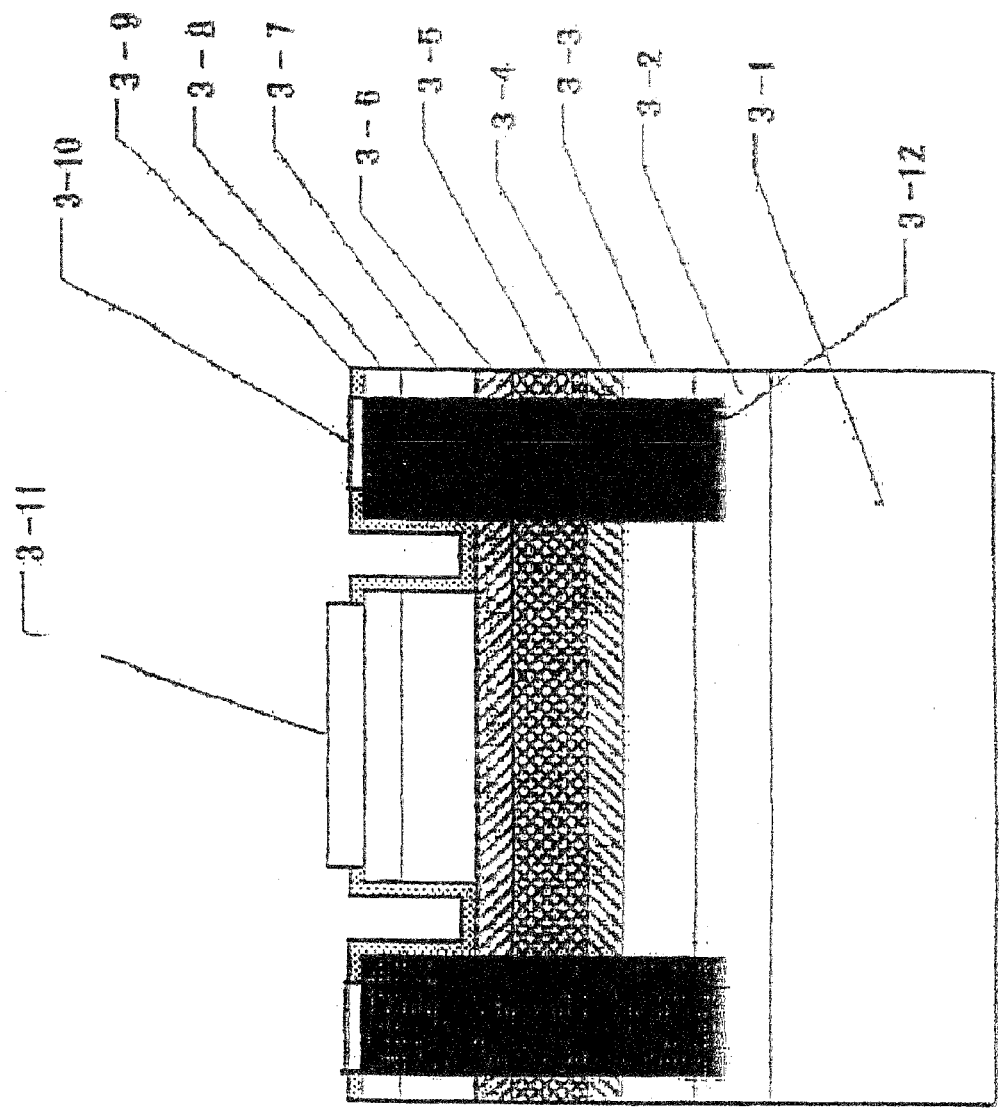
FIG. 7 is an explanatory diagram (1) of a background art.
Figure 8:
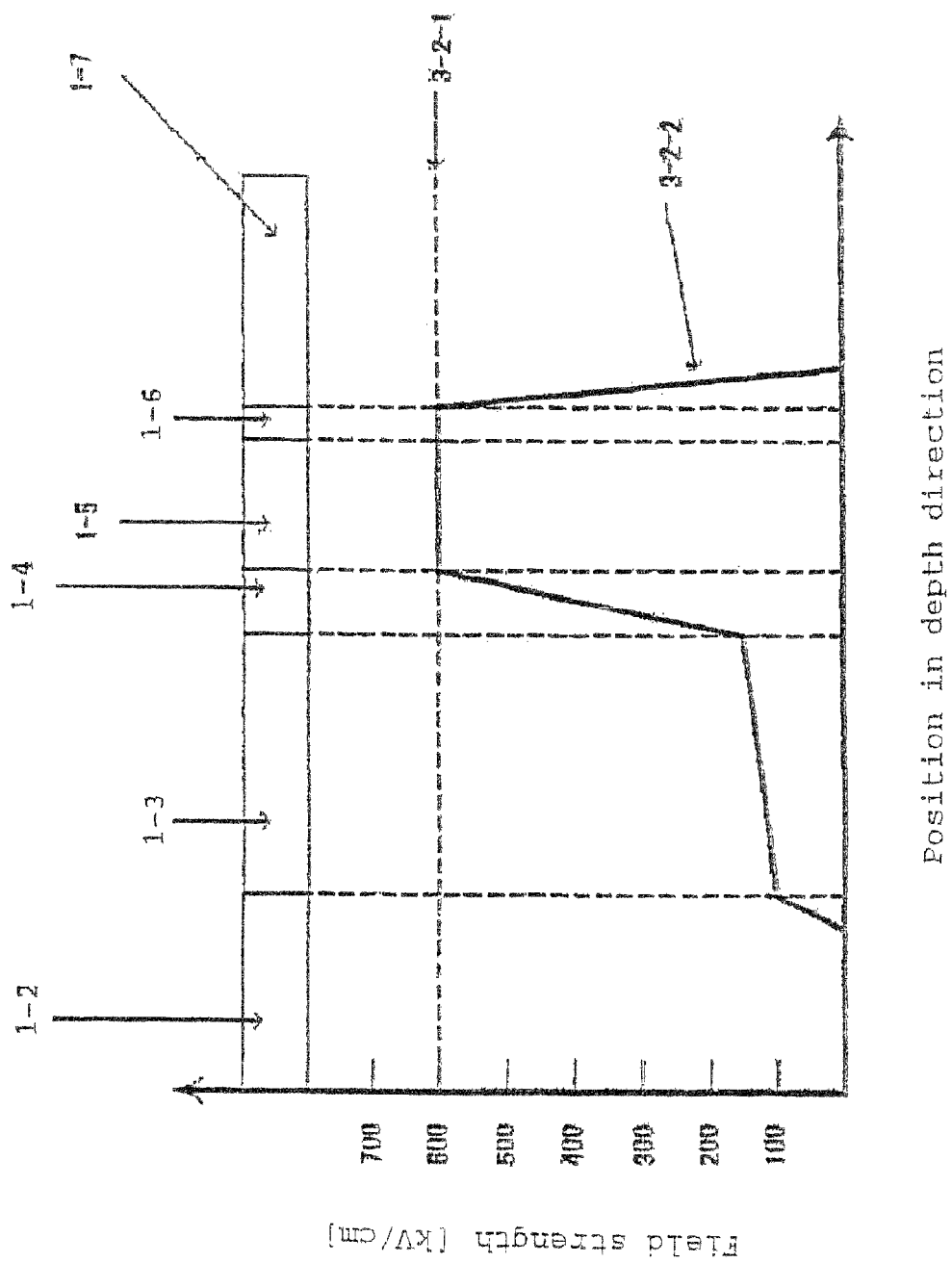
FIG. 8 is an explanatory diagram (2) of a background art.

As shown in FIG. 6, on an n type (or an SI type) InP substrate 2-3-1, there are laminated a p type buffer layer formed from InP, InAlAs or InAlGaAs 2-3-2, a p type light-absorbing layer formed from InGaAs 2-3-3, a p type field buffer layer 2-3-4, a multiplication layer 2-3-5-1, an n type field buffer layer 2-3-5-1, an etching stopper layer 2-3-6, an n type buffer layer 2-3-7 and an n type contact layer 2-3-8 and a planar type APD is obtained by performing isolation etching, SiN$_x$ dielectric passivation and the like for this structure.

InAlAs which has a film thickness of 0.2 μm and is not doped is used as the multiplication layer 2-3-5-1, InAlAs having a film thickness of 0.1 μm and a concentration of $1\times10^{17}$ (cm$^{-3}$) is used as the n type field buffer layer 2-3-5-2, In P of 0.1 μm is used as the etching stopper layer 2-3-6, InAlAs having a film thickness of 0.5 μm and a concentration of $1\times10^{18}$ (cm$^{-3}$) is used as the n type buffer layer 2-3-7, and InGaAs having a film thickness of 0.2 μm and a concentration of $5\times10^{18}$ (cm$^{-3}$) is used as the n type contact layer 2-3-7.

This n type field buffer layer has the function of lowering an electric field by 145 (kV/cm), and even in the operation condition under which the maximum value of the multiplier electrical field is 700 (kV/cm), the electric field applied to the InP etching stopper layer becomes 555 (kV/cm).

As a result of this, it is possible to simultaneously meet the requirement that the multiplication layer be a structure having a multiplier electrical field higher than the breakdown electrical field strength of the etching stopper layer and the requirement that the structure have a low dark current.

In a device thus fabricated, a dark current decreased on the whole surface in the interior of a wafer. A dark current In an element with a photo-detecting diameter of 30 μm was measured. Under the condition where the temperature is 0 to 85 (° C.), it was possible to obtain a dark current of not more than 500 (nA) at 0.9 Vb. Vb is breakdown voltage.

For the GB product, it was possible to obtain a gain bandwidth product of 85 (GHz) (under a load of 50 (Ω)).

It is estimated that device reliability is not less than 1 million hours.

These characteristics are especially effective for use in optical receivers for optical communication.

To simultaneously meet these characteristics is made possible only when the structure proposed in the present specification is used.

The invention claimed is:

1. A semiconductor photo-detecting element, comprising:
   a semiconductor substrate;
   a buffer layer of a first conductivity type on the semiconductor substrate;
   a light-absorbing layer on the buffer layer;
   a field buffer layer of the first conductivity type on the light absorbing layer;
   a multiplication layer on the field buffer layer;
   an etching stopper layer on the multiplication layer;
   a buffer layer of a second conductivity type on the etching stopper layer; and
   a contact layer of the second conductivity type on the buffer layer, wherein
   a first field strength applied to the etching stopper layer, measured in a depth direction running through each of the layers, is lower than a second field strength applied to the multiplication layer as measured in the depth direction.

2. The semiconductor photo-detecting element according to claim 1, wherein an impurity of the light-absorbing layer is the first conductivity type.

3. The semiconductor photo-detecting element according to claim 1, wherein an impurity of the light-absorbing layer is the second conductivity type.

4. The semiconductor photo-detecting element according to claim 1, wherein,
   a breakdown electrical field strength of the etching stopper layer is lower than a breakdown electrical field strength of the multiplication layer, and
   the first field strength applied to the etching stopper layer is lower than the breakdown electrical field strength of the etching stopper layer.

5. The semiconductor photo-detecting element according to claim 1, wherein,
   a breakdown electrical field strength of the etching stopper layer is lower than a breakdown electrical field strength of the multiplication layer, and
   the second field strength applied to the multiplication layer is higher than the breakdown electrical field strength of the etching stopper layer.

6. The semiconductor photo-detecting element according to claim 1, further comprising:
   a second field buffer layer of the second conductivity type between the multiplication layer and the etching layer configured to relax the field of the multiplication layer.

7. The semiconductor photo-detecting element according to claim 6, wherein
   an impurity of the multiplication layer is of the first conductivity type.

8. The semiconductor photo-detecting element according to claim 6, wherein
   an impurity of the multiplication layer is the second conductivity type.

9. The semiconductor photo-detecting element according to claim 6, wherein,
   the layer thickness ($dm(cm)$) of the field buffer layer of the second conductivity type, the impurity concentration of the second conductivity type ($Ndk$ ($cm^{-3}$)) of the field buffer layer, and the magnitude of an electric field ($\Delta Ek$ ($kV/cm$)) satisfy the relationship $Ndk \geq k \times eO \times \Delta Ek/(q \times dk)$ (where k is the dielectric constant of the field buffer layer, eO is the permittivity in a vacuum, and q is the elementary quantity of electric discharge), and
   the electric field relaxes the second field strength applied to the multiplication layer.

10. The semiconductor photo-detecting element according to claim 1, wherein an impurity of the multiplication layer is of the second conductivity type and has an impurity concentration of not less than $1 \times 10^{16}$ ($cm^{-3}$).

11. The semiconductor photo-detecting element according to claim 1, wherein the multiplication layer is a single layer in which the ratio of elements forming the multiplication layer is constant.

12. The semiconductor photo-detecting element according to claim 11, wherein the multiplication layer is a layer formed from InAlAs.

13. The semiconductor photo-detecting element according to claim 12, wherein the etching stopper layer is a layer formed from InP or $In_xGa_{(1-x)}As_yP_{(1-y)}$ ($0 \leq x \leq 1.0$, $0 \leq y \leq 1.0$).

14. The semiconductor photo-detecting element according to claim 11, wherein the multiplication layer has a thickness of not more than 0.3 μm.

15. The semiconductor photo-detecting element according to claim 1, wherein,
   the layer thickness ($dm(cm)$) of the multiplication layer, the impurity concentration of the second conductivity type ($Ndm$ ($cm_{-3}$)) of the multiplication layer, and the magnitude of an electric field ($\Delta Em$ ($kV/cm$)) satisfy the relationship $Ndm \geq k \times eO \times \Delta Em/(q \times dm)$ (where k is the dielectric constant of the multiplication layer, eO is the permittivity in a vacuum, and q is the elementary quantity of electric discharge), and
   the electric field relaxes the second field strength applied to the multiplication layer.

16. The semiconductor photo-detecting element according to claim 1, wherein the first field strength is lower at any portion of the etching stopper layer than the second field strength.

17. The semiconductor photo-detecting element according to claim 1, wherein the multiplication layer reduces an electric field applied to the etching stopper layer such that the first field strength applied to the etching stopper layer is lower than the breakdown electrical field strength of the etching stopper layer.

* * * * *